United States Patent [19]

Kaplan et al.

[11] 4,129,862

[45] Dec. 12, 1978

[54] APPARATUS FOR DIGITALLY ENCODING THE ANGULAR POSITION OF A SHAFT WITH RESPECT TO A REFERENCE BEARING

[76] Inventors: Irving I. Kaplan, 712 Kahn Dr., Baltimore, Md. 21208; Daniel J. Lincoln, 12002 Terra La., Bowie, Md. 20715

[21] Appl. No.: 665,649

[22] Filed: Mar. 10, 1976

[51] Int. Cl.² .................. H03K 13/02; G01D 5/34
[52] U.S. Cl. .................. 340/347 P; 235/92 MP; 250/231 SE
[58] Field of Search ....... 340/347 P, 347 M, 347 AD; 250/231 SE; 235/92 MP

[56] References Cited

U.S. PATENT DOCUMENTS

| 2,675,962 | 4/1954 | Couffignal | 340/347 P |
| 2,770,798 | 11/1956 | Roth | 340/347 P |

Primary Examiner—Thomas J. Sloyan

[57] ABSTRACT

A high resolution digital angle encoder for determining the angular position of a first shaft with respect to a reference position. A signal generator operates through a three-stage counter to provide an excitation signal to a motor which turns a second shaft. The second shaft cooperates with a reference position detector and a shaft position detector to respectively initiate and terminate the storage of the counts of the three-stage counter in a storage register.

20 Claims, 6 Drawing Figures

APPARATUS FOR DIGITALLY ENCODING THE ANGULAR POSITION OF A SHAFT WITH RESPECT TO A REFERENCE BEARING

BACKGROUND OF THE INVENTION

1. Field of the Invention:

The invention relates to angular position digital encoders having a high degree of resolution.

2. Description of the Prior Art:

Prior art digital angular position encoders such as those used to digitally encode the angular position of a radar antenna, have employed magnetic or optical sensing devices mounted on a stationary base to measure angular position. The basic encoder technique quantizes angular position by using many narrow markings spaced around the perimeter of a disc. The disc is concentrically attached to the shaft whose angular position is being measured so that, as the shaft is rotated to a given position, digitally coded signals are generated which are a function of the shaft position. When attempting to achieve high resolution of the angular position, the limitation of the number of markings that can be placed on the perimeter of the disc led to gearing and backlash problems which increased the encoders' physical size and cost. For example, 2048 bits of resolution can be typically obtained from a magnetic material spaced on one and one-half mil centers on a one inch diameter disc. Where, however, resolution on the order of $2^{16}$ bits is required, the prior art digital shaft encoders become large and expensive.

Prior art digital angle encoders also include devices which measure the angular position of a first shaft in relation to the angle of rotation of a second shaft between a reference position and a first angle position. However the resolution of the angular position detected by this prior art device was limited by the frequency range of a timing signal which was dependent on the number of magnetic impressions, or other identifying marks that could be placed on the perimeter of a disc. Although the frequency range of the timing signal for the device could be increased, this would be at the expense of the compensation for the variations in rotational speed of the drive motor.

Therefore, there was a need for an improved digital angular encoder for use in applications requiring the digital encoding of an angular shaft position to a high degree of resolution.

SUMMARY OF THE INVENTION

The invention comprises apparatus for digitally encoding the angular position of a first shaft which is measured by a concentrically disposed second shaft cooperating with a reference position detector and a shaft position detector. The second shaft is rotated at a substantially constant speed by a constant speed motor which is excited from a counter which is provided with an oscillatory signal from a signal generator. As the constant speed motor turns the second shaft at a substantially constant speed in response to the excitation signal of the counter, an indicating element carried on the second shaft cooperates with the reference position detector to cause the reference position detector to provide a reset signal to the counter which returns the stages of the counter to an initial count value. As the second shaft continues to rotate, the pulses of the excitation signal are counted by the stages of the counter and stored in a storage register until the indicating element carried on the second shaft passes a shaft position sensor which causes a position pulse detector to provide a clock signal to the storage register to terminate the storage of counts made by the stages of the counter. The angular position of the first shaft is determined from the number of counts stored in the storage register in proportion to the predetermined number of total counts of the counter for each revolution of the constant speed motor.

To correct for variations from a precisely constant speed of the second shaft, the shaft may be provided with a speed indicating element which cooperates with a speed detector to control the frequency of a variable signal generator.

DESCRIPTION OF THE PREFERRED EMBODIMENT

Figure 1:
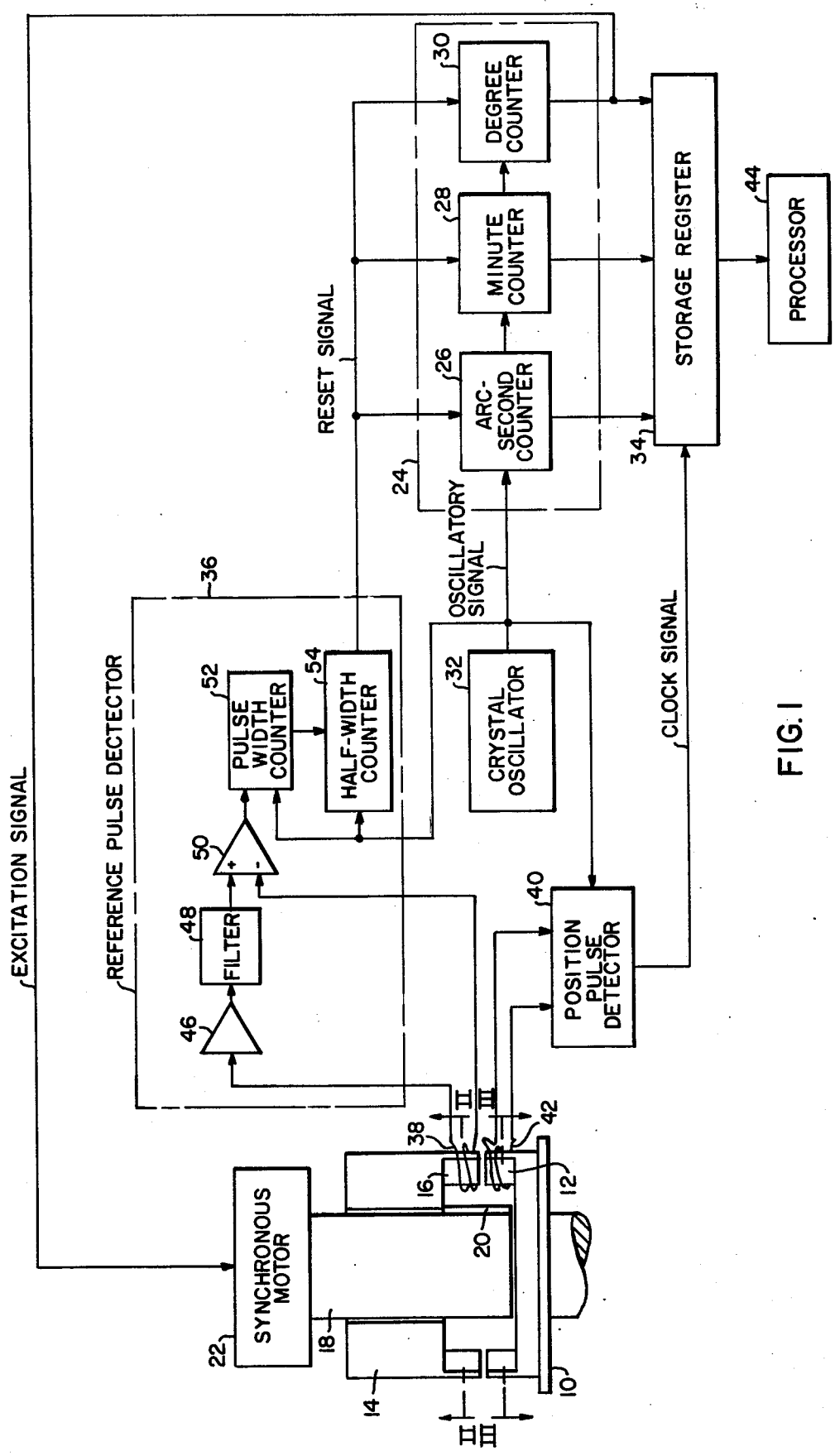
FIG. 1 is a block diagram of the disclosed method and apparatus for digitally encoding the angular position of a first shaft in relation to a concentrically disposed second shaft.
Figure 2:
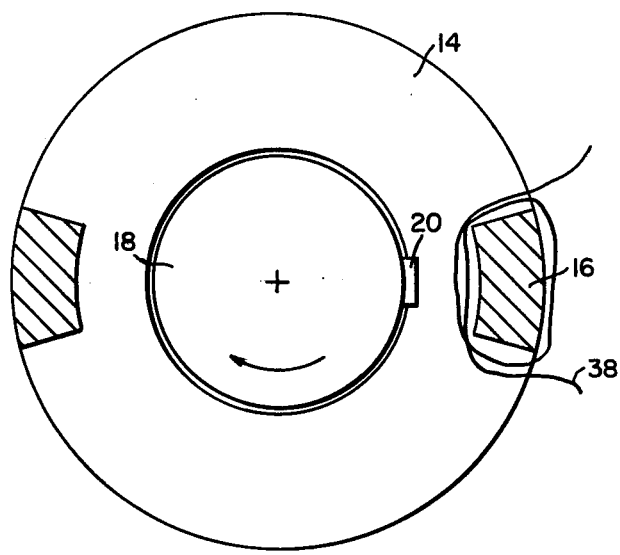
FIG. 2 is a horizontal cross section of the first and second shafts and the reference position sensor of FIG. 1 taken along lines II—II of FIG. 1.
Figure 3:
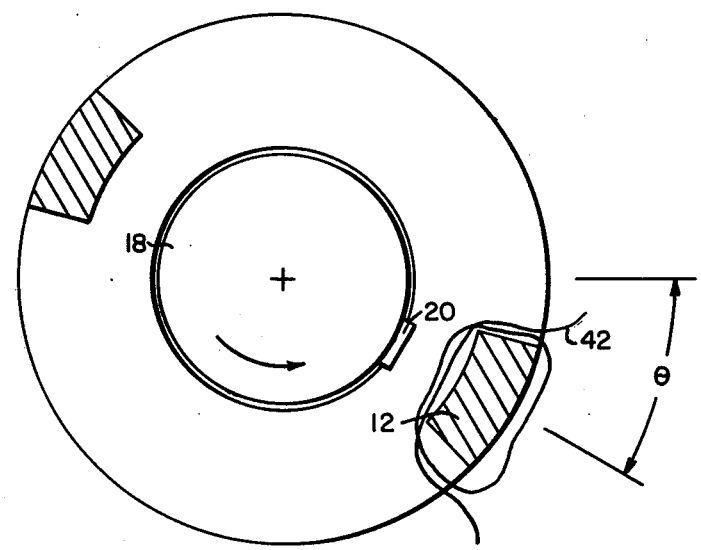
FIG. 3 is a horizontal cross section of the first and second shafts and the shaft position detector sensor of FIG. 1 taken along lines III—III of FIG. 1.

In the disclosed angular position encoder of FIG. 1, details of which are further described in FIGS. 2 and 3, the angular position of a first shaft 10, which is marked by a first shaft position post 12, is determined in relation to a reference bearing 14 provided with a bearing reference post 16. A second shaft 18 is disposed in concentric relation to said first shaft 10 and is provided with an indicating element which, for example could be comprised of magnetic material 20. Second shaft 18 is coupled to a motive means for rotating the second shaft 18 which, for example, could be comprised of synchronous motor 22 whose windings are provided with excitation signals from a counting means which may be comprised of three-stage counter 24 which includes arc-second counter 26, minute counter 28 and degree counter 30. Three-stage counter 24 provides excitation signals to the synchronous motor 22 in response to an oscillatory signal which is provided from a signal generating means which, for example, may be comprised of a crystal oscillator 32. Three-stage counter 24 also provides an angle incremental signal to a storage means, which may be comprised of a storage register 34, in response to the oscillatory signal of crystal oscillator 32 and a reset signal provided by a reference position detector means which may include a reference position sensor means which, for example, may be comprised of a reference coil 38) and reference pulse detector 36. The storage of the angle incremental signal comprised of the count pulses of counters 26, 28 and 30 of three-stage counter 24 in storage register 34 is terminated by a clock signal provided by a shaft position detector means comprised of a shaft position sensor means (which for example, may be comprised of shaft position coil 42) and a position pulse detector 40.

In the detection of the angular position of the first shaft 10 with respect to the reference bearing 14, crystal oscillator 32 provides a 5.184 megahertz oscillatory signal to three-stage counter 24 which, as explained later, processes this signal to provide a 60 Hertz squarewave excitation signal to synchronous motor 22 which rotates second shaft 18 at a substantially constant angular velocity. Arc-second counter 26 of the three-stage counter 24 counts every fourth pulse of the 5.184 megahertz output signal of crystal oscillator 32 so that, since second shaft 18 is making essentially 60 revolutions per second, arc-second counter 26 makes one count and provides an output pulse each time second shaft 18 turns 15 arc-seconds. The output pulses of arc-second counter 26 are provided to minute counter 28 which makes one count and provides an output pulse for every 60 arc-second pulses received so that minute counter 28 provides an output pulse each time second shaft 18 rotates by an angle of one minute. Degree counter 30 provides a degree output for every 60 output pulses of minute counter 28 so that degree counter 30 makes one count and provides an output pulse each time second shaft 18 rotates by an angle of one degree. For an oscillatory signal of 5.184 megahertz provided to arc-second counter 26, degree counter 30 provides a 60 Hertz output signal which, as shown in FIG. 1, is also the excitation signal for the motor 22. For each revolution of second shaft 18, magnetic material 20 is carried past reference coil 38 which is centered on bearing reference post 16, as shown in FIG. 2, and is also carried past shaft position coil 42 centered on first shaft position post 12 as shown in FIG. 3.

For the measurement of the angle designated as $\theta$ in FIG. 3, the magnetic material 20 is carried past reference coil 38 and a reference pulse is provided to reference pulse detector 36 which determines the position of bearing reference post 16 in as a function of the center of the reference pulse as explained later, to provide a reset signal which returns the count values of counters 26, 28 and 30 to zero. Counters 26, 28 and 30 then continue cumulatively counting in response to the oscillatory signal of crystal oscillator 32 until another reset signal is applied by reference pulse detector 36 on the next revolution of second shaft 18. During the operation of counter 24, the count values of counters 26, 28 and 30 are continuously provided to storage register 34. As second shaft 18 continues its revolution, at the angle $\theta$ it passes shaft position coil 42 centered on first shaft position post 12 causing the shaft position coil 42 to provide a position pulse to position pulse detector 40 which provides a clock signal to storage register 34 to terminate the storage of the count values accumulated in counters 26, 28 and 30 since the application of the last reset signal. Recalling that counter 26 makes a count for each 15 arc-seconds of rotation of shaft 18, counter 28 makes a count for each minute of rotation of shaft 18 and counter 30 makes a count for each degree of rotation of shaft 18, it can be seen that the values of counters 26, 28 and 30 which are stored in storage register 34 provides an indication of the angular position of the first shaft 10 with respect to the reference bearing 14 which is accurate to within 15 arc-seconds. This digitally encoded angle is then available for use by a digital computer or other processor 44 until the next revolution of second shaft 18 when reference pulse detector 36 provides another reset pulse in response to the passage of magnetic material 20 past reference coil 38. Of course, a more accurate determination of the angular position of first shaft 10 could be obtained by modifying arc-second counter 26 to count more pulses from crystal oscillator 32 and, if necessary, by increasing the operational frequency of crystal oscillator 32.

Reference pulse detector 36 is comprised of amplifier 46, filter 48, operational amplifier 50, pulse width counter 52 and half-width counter 54. Amplifier 46 and filter 48 operate to provide an amplified, filtered reference pulse from reference coil 38 to operational amplifier 50 which provides a first input to pulse width counter 52. A second input to pulse width counter 52 is provided from crystal oscillator 32 such that pulse width counter 52 counts the number of pulses of the oscillatory signal of crystal oscillator 32 which occur within the reference pulse of reference coil 38 on the Nth revolution of second shaft 18. On the N + 1 revolution of second shaft 18, the count of pulse width counter 52 is transferred to half-width counter 54 where it is used to determine the reference position for the N + 1 revolution. Half-width counter 54 is also provided with the oscillatory signal of crystal oscillator 32 and operates to count to a value which is one-half the number of pulses counted by pulse width counter 52 on the Nth revolution of second shaft 18. When half-width counter 54 reaches this value, it provides the reset signal to counters 26, 28, and 30. From the foregoing explanation, it will be realized that the reference pulse detector 36 operates to detect the reference position based on information which was compiled during the previous revolution of shaft 18. In the present angular position encoder, this is acceptable because the width of the output pulse of reference coil 38 measured in terms of the pulses of crystal oscillator 32 does not vary significantly between revolutions of the second shaft 18. Similarly, position pulse detector 40 is comprised of an amplifier, a filter, an operational amplifier, a pulse width counter and a half-width counter, and provides a clock signal in relation to the position pulse of shaft position coil 42 in essentially the same manner.

Figure 4:
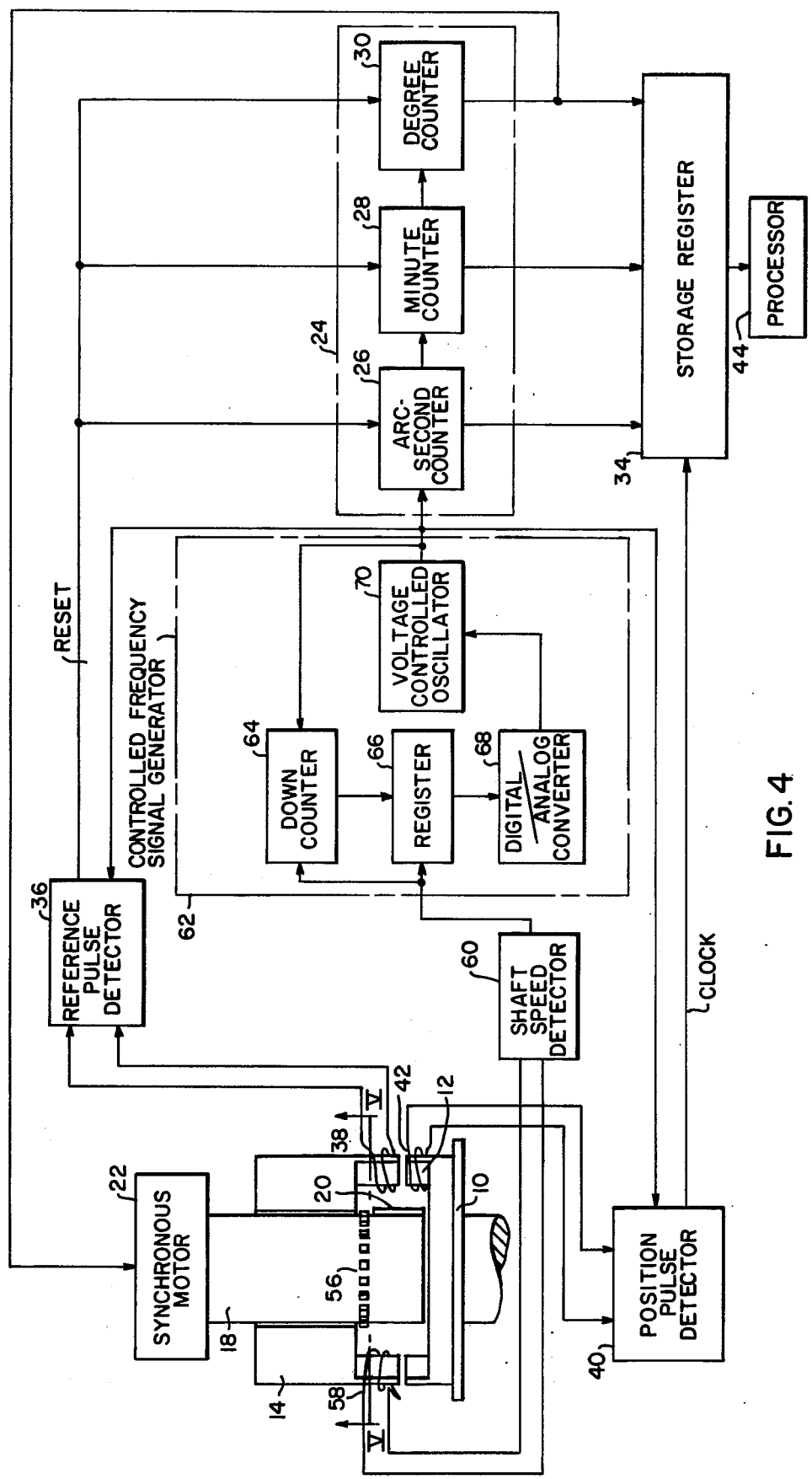
FIG. 4 represents a modification of the embodiment of FIG. 1 in which a speed indicating element and a shaft speed sensor have been added and the signal generator has been replaced by a controlled frequency generator which is responsive to the speed sensor.
Figure 5:
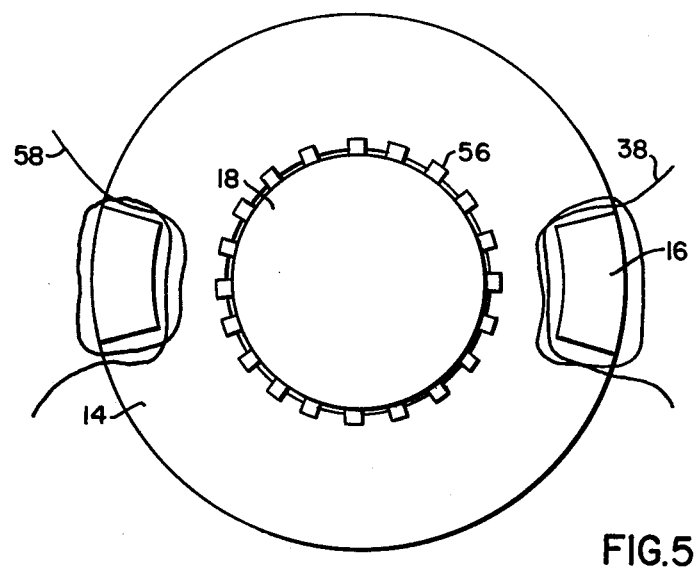
FIG. 5 shows a horizontal cross section of the first and second shafts, the speed indicating element the reference position sensor, and the shaft speed sensor of FIG. 4 taken along lines V—V of FIG. 4.

FIGS. 4 and 5 show a modification of the embodiment of the angular position encoder of FIG. 1 which corrects for variations in the angular velocity of second shaft 18. Although constant speed motors, such as synchronous motor 22 used in the embodiment of FIG. 1, maintain a sufficiently constant speed for most purposes, in applications such as the precise measurement of the angular position of a shaft, the variations in angular velocity during any particular cycle of the synchronous motor 22 may become significant. For example, if the angular velocity of synchronous motor 22 varied from a 60 Hz average velocity by one-half of one percent it can be demonstrated that an error in the angular position of first shaft 10 of nine tenths of one degree would result.

To compensate for the angular variations, the apparatus of FIG. 4 is provided with a speed indicating element which, for example, may be comprised of magnetic material 56; a speed sensing element which, for example, may be comprised of a speed sensing coil 58; and a shaft speed detector 60. In addition the signal generating means of crystal oscillator 32 is replaced by a signal generating means comprised of a controlled frequency generator 62 which includes down converter 64, register 66, digital-to-analog converter 68 and voltage controlled oscillator 70. In essentially the same manner as the embodiment of FIG. 1, the angular position encoder of FIG. 4 determines the angular position of first shaft 10 in relation to reference bearing 14 by initiating the counting sequence of counters 26, 28 and 30 in relation to a reset signal provided by reference pulse detector 36 in response to a reference pulse from reference coil 38 upon the passage of magnetic material 20. The storage of the values of counters 26, 28 and 30 in storage register 34 is terminated by a clock signal provided by position pulse detector 40 in response to a position pulse from position coil 42 due to the passage of magnetic material 20. However, in the embodiment of FIG. 4, the frequency of the oscillating signal output of controlled frequency signal generator 62 may be adjusted to correct variations in the angular velocity of second shaft 18 during the course of any particular revolution. This speed regulation is accomplished by closing the loop between second shaft 18 and controlled frequency signal generator 62. Magnetic material 56 is provided with a predetermined number of teeth each of which cause speed sensing coil 58 to provide a speed output pulse to shaft speed detector 60. In the embodiment of FIG. 4 and as shown in FIG. 5 which is taken along the line V—V of FIG. 4, the magnetic material 56 contains twenty teeth so that, for each revolution of second shaft 18, speed sensing coil 58 will provide 20 pulses to speed detector 60. Speed detector 60 is comprised of an amplifier, a filter, an operational amplifier, a pulse width counter and a half-width counter which operate in essentially the same manner as previously described in relation to reference pulse detector 36. Speed detector 60 regulates the frequency of the oscillatory signal provided by controlled frequency signal generator 62 by providing a calibration pulse signal to down counter 64 and register 66 in response to the speed pulse signals received from speed sensing coil 58. Down counter 64 is provided with a predetermined initial value in response to each calibration pulse received from speed detector 60 which value is counted down by the pulses of the oscillation signal of voltage controlled oscillator 70 to determine the angular position of the first shaft 10 to an accuracy within 3 arc-seconds.

For an angular velocity of second shaft 18 of 60 Hertz, voltage controlled oscillator 70 must operate at a frequency of 25.92 megahertz. This would provide 432,000 pulses for each revolution of second shaft 18 or, for a magnetic material 56 having 20 teeth, 21,600 pulses between each calibration pulse of speed detector 60. The calibration pulses of speed detector 60 are also provided to register 66 which transfers any deviation from zero remaining in down counter 64 to digital-to-analog converter 68 which converts the digital number transferred by register 66 to an analog value and provides this analog value to voltage controlled oscillator 70 to adjust the frequency of the oscillatory signal provided to counter 24. For example, if down counter 64 had one hundred counts remaining upon the introduction of the calibration pulse from speed detector 60, register 66 would transfer this one hundred count value to digital-to-analog converter 68 which would then increase the frequency of the oscillatory output signal provided by voltage controlled oscillatory 70 to counter 24 and the frequency of the resultant excitation signal provided to synchronous motor 22. If down converter 64 had a value of minus one hundred upon the introduction of the next calibration pulse from speed detector 60, register 66 would transfer this value to digital-to-analog converter 68 which would cause voltage controlled oscillator 70 to decrease the frequency of its output signal thereby decreasing the frequency of the excitation signal provided to synchronous motor 22.

The pulse width counters of detectors 36, 40 and 60 may be provided with a preset advance which could compensate for propagation time of the respective detector. For example, pulse width counter 52 could be provided with an advance of 2D counts so that the preload value transferred to half-width counter 54 on the next clock pulse of crystal oscillator 32 or, in the embodiment of FIG. 4, controlled frequency signal generator 62, would be D clock pulses where D is the number of clock pulses that would occur during the propagation time of reference pulse detector 36. In a similar fashion, down converter 64 could be provided with a preset advance which would compensate for the propagation time of controlled frequency signal generator 62.

Figure 6:
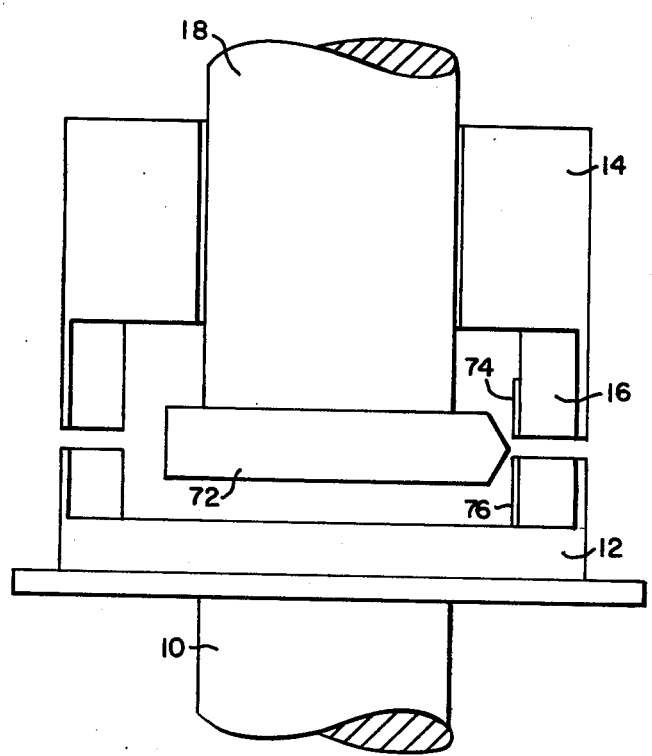
FIG. 6 shows an alternative embodiment of the reference position sensor and the shaft position sensor of FIG. 1.

FIG. 6 shows another example of an indicating element which is comprised of an optical element 72 and another example of a reference sensor and position sensor comprised of optical sensor 74 and optical sensor 76 respectively. These could be used to replace the magnetic material 20, reference coil 38 and position coil 42 respectively. Optical element 72 could be comprised of a flat reflecting surface and optical sensors 74 and 76 could be comprised of a light emitting diode paired with a photo-detector centered on the reference bearing post 16 and the first shaft position post 12. In an analogous manner, the speed indicating element and the speed sensor of FIG. 4 could be comprised of a twenty-sided reflector and an optical speed sensor which would replace magnetic material 56 and speed sensing coil 58 respectively. As with optical element 72, the twenty-sided reflector could be comprised of a reflective surface and, as with optical sensors 74 and 76, the optical speed sensor could be comprised of a light emitting diode which is paired with a photodetector mounted at a fixed position on reference bearing 14.

It will be realized by those skilled in the art that, if the position of the first shaft 10 is dynamic and is known to vary in some predictable manner, then the precise angular position of the first shaft 10 can be determined by determining the angular position of the first shaft in the manner previously described for known instances of time, and then applying these angular positions to the pattern which the dynamic first shaft is known to follow. For example, if first shaft 10 is known to rotate at a constant speed a determination of the angular position at time $t_1$ and a subsequent determination at time $t_2$ could be compared to determine the speed of the first shaft which could be used together with the angular position at either $t_1$ or $t_2$ to determine the angular position of the shaft at any subsequent point in time. If the angular velocity of the first shaft were known at the onset, only one angular position of the shaft would be necessary. If the angular velocity is not known, a sampling of only two angular positions leaves open the possibility that a harmonic of the actual angular velocity could also support the detected positions. This potential source of error could be eliminated by additional samplings of angular positions as is well known in the art.

Extrapolating from the example of a first shaft having a constant angular velocity, it will be seen that the same method could be used to determine the angular position of a first shaft having a non-constant angular velocity between angular position output pulses of the disclosed device. That is, between the time required for second shaft 18 to make a complete revolution and provide the next succeeding clock pulse to the storage register 34.

What is claimed is:

1. Apparatus for digitally encoding the angular position of a first shaft with respect to a reference position, said apparatus comprising:
   a second shaft having an indicating element, said second shaft being concentrically disposed with respect to said first shaft;
   signal generating means for generating an output signal of a predetermined frequency;
   counting means for providing an excitation signal and an incremental angle signal in response to the output signal of said signal generating means;
   motive means for rotating said second shaft at a predetermined average rate in response to the excitation signal of said counting means;
   reference position detector means responsive to the indicating element of said second shaft to provide a reset signal as a function of the angular position of the second shaft with respect to said reference position, said reset signal being provided to said counting means to initialize the incremental angle signal;
   shaft position detector means responsive to the indicating element of said second shaft to provide a clock signal as a function of the angular position of said second shaft with respect to said first shaft; and
   storage means responsive to the angle incremental signal and to the clock signal, said storage means storing the incremental angle signal in response to the clock signal to provide an angular position signal.

2. The apparatus of claim 1 in which said reference position detector means includes:
   a reference position sensor for providing a reference signal as a function of the disposition of said indicating element with respect to said reference position sensor; and
   a reference pulse detector for providing a reset signal in response to the reference signal of said reference position sensor.

3. The apparatus of claim 1 in which said incremental angle signal comprises arc-second, minute, and degree signals and in which said counting means includes:
   an arc-second counter for providing arc-second counts in response to the output signal of said generating means, and for accumulating said arc-second counts to provide an arc-second signal;
   a minute counter for providing minute counts in response to the arc-second signal of said arc-second counter and for accumulating said minute counts to provide a minute signal; and
   a degree counter for providing degree counts in response to the minute signal of said minute counter, said degree counter accumulating said degree counts to provide a degree signal that is the excitation signal to said motive means.

4. The apparatus of claim 1 in which said shaft position detector means includes:
   a shaft position sensor for providing a shaft position signal as a function of the disposition of said indicating element with respect to said shaft position sensor; and
   a position pulse detector for providing a clock signal in response to the shaft position signal of said shaft position sensor.

5. The apparatus of claim 1 in which said signal generating means comprises a crystal oscillator.

6. The apparatus of claim 2 in which said reference pulse detector comprises:
   an operational amplifier for providing a counter enable signal in response to the reference signal of said reference position sensor;
   a pulse width counter for providing a pulse width signal in response to the counter enable signal and the output signal of said signal generating means; and
   a half-width counter for providing the reset signal in response to the pulse width signal of said pulse width counter in combination with the output signal of said signal generating means.

7. The apparatus of claim 6 in which said pulse width counter is provided with a predetermined advance which compensates for the propagation time of said reference pulse detector.

8. The apparatus of claim 4 in which said position pulse detector comprises:
   an operational amplifier for providing a counter enable signal in response to the shaft position signal of said shaft position sensor;
   a pulse width counter for providing a pulse width signal in response to the counter enable signal and the output signal of said signal generating means; and
   a half-width counter for providing said clock signal in response to the pulse width signal of said width counter in combination with the output signal of said signal generating means.

9. The apparatus of claim 8 in which said pulse width counter includes a predetermined advance which compensates for the propagation time of said position pulse detector.

10. The apparatus of claim 1 in which said indicating elements comprises a magnetic material located on the surface of said second shaft and in which said reference position sensor comprises a reference coil.

11. The apparatus of claim 1 in which said indicating element comprises a magnetic material located on the surface of said second shaft and in which said shaft position sensor comprises a shaft position coil.

12. The apparatus of claim 1 in which said indicating element comprises an optical reflecting means, and in which said reference position sensor comprises a photo detector coupled with a light emitting diode.

13. The apparatus of claim 1 in which said indicating element comprises an optical reflecting means, and in which said shaft position sensor means comprises a photo detector coupled with a light emitting diode.

14. Apparatus for digitally encoding the angular position of a first shaft with respect to a reference position, said apparatus comprising:
   a second shaft having an indicating element and a speed indicating element, said second shaft being concentrically disposed with respect to said first shaft;
   controlled frequency signal generating means for generating an output signal that is regulated in response to a calibration signal;

counting means for providing an excitation signal and an incremental angle signal in response to the output signal of said controlled frequency signal generating means;

motive means for rotating said second shaft at a predetermined average rate in response to the excitation signal of said counting means;

shaft speed detecting means responsive to the speed indicating element of said second shaft to provide a calibration signal as a function of the angular position of said second shaft with respect to said reference position, said calibration signal being provided to said controlled frequency signal generating means to regulate the output signal of the controlled frequency generating means, thereby regulating the angular velocity of said second shaft;

reference position detector means responsive to the indicating element of said second shaft to provide a reset signal as a function of the angular position of the second shaft with respect to said reference position, said reset signal being provided to said counting means to initialize the incremental angle signal;

shaft position detector means responsive to the indicating element of said second shaft to provide a clock signal as a function of the angular position of said second shaft with respect to said first shaft; and storage means responsive to the angle incremental signal and to the clock signal, said storage means storing the incremental angle signal in response to the clock signal to provide an angular signal.

15. The apparatus of claim 14 in which said controlled frequency signal generating means comprises:

a down counter which provides a speed error signal in response to the calibration signal of said shaft speed detecting means in combination with the output of the controlled frequency signal generating means;

a register for transferring the speed error signal of said down counter in response to the calibration signal of said shaft speed detecting means;

a digital-to-analog converter for providing an analog voltage control signal in response to said speed error signal transferred by said registor; and a voltage controlled oscillator for providing the output signal in response to the analog voltage control signal of said digital-to-analog converter.

16. The apparatus of claim 14 in which shaft speed detecting means comprises:

a shaft speed sensor for providing a speed pulse signal as a function of the disposition of said speed indicating element with respect to said shaft speed sensor; and a shaft speed detector for providing the calibration signal in response to the speed pulse signal of said shaft speed sensor.

17. The apparatus of claim 16 in which said shaft speed detector comprises:

an operational amplifier for providing a counter enable signal in response to the speed pulse signal of said shaft speed sensor;

a pulse width counter for providing a pulse width signal in response to the counter enable signal and the output signal of said controlled frequency signal generating means; and a half-width counter for providing the calibration signal in response to the pulse width signal of said pulse width counter in combination with the output signal of said controlled frequency signal generating means.

18. The apparatus of claim 17 in which said pulse width counter includes a predetermined advance which compensates for the propagation time of said shaft speed detector.

19. The apparatus of claim 14 in which said speed indicating element comprises a magnetic material located on the surface of said second shaft and in which said shaft speed sensor comprises a speed sensing coil.

20. The apparatus of claim 14 in which said speed indicating element comprises a polygonally-sided optical reflecting means, and in which said shaft speed sensor comprises a photo detector coupled with a light emitting diode.

* * * * *